United States Patent
Casey et al.

(10) Patent No.: US 9,309,855 B2
(45) Date of Patent: Apr. 12, 2016

(54) METHOD AND DEVICE FOR MONITORING A MESHING PROCESS OF A MESHING PINION OF A STARTER MOTOR

(75) Inventors: Simon Casey, Caulfield (AU); Tony Rocco, Chelsea (AU)

(73) Assignee: Robert Bosch GmbH, Stuttgart (DE)

( * ) Notice: Subject to any disclaimer, the term of this patent is extended or adjusted under 35 U.S.C. 154(b) by 247 days.

(21) Appl. No.: 14/131,431

(22) PCT Filed: Jun. 15, 2012

(86) PCT No.: PCT/EP2012/061415
§ 371 (c)(1),
(2), (4) Date: Apr. 9, 2014

(87) PCT Pub. No.: WO2013/007472
PCT Pub. Date: Jan. 17, 2013

(65) Prior Publication Data
US 2014/0298896 A1  Oct. 9, 2014

(30) Foreign Application Priority Data
Jul. 8, 2011 (DE) .......... 10 2011 078 839

(51) Int. Cl.
*G01M 15/02* (2006.01)
*F02N 11/10* (2006.01)
*F02N 11/08* (2006.01)
(Continued)

(52) U.S. Cl.
CPC .......... *F02N 11/108* (2013.01); *F02N 11/0851* (2013.01); *G01R 31/34* (2013.01); *F02D 2041/1416* (2013.01); *F02D 2041/1417* (2013.01); *F02N 15/067* (2013.01); *F02N 2200/047* (2013.01); *F02N 2200/065* (2013.01)

(58) Field of Classification Search
CPC .. G01M 15/02; F02N 11/108; F02N 11/0851; F02N 2200/047
USPC .............................. 73/114.59, 114.77, 116.04
See application file for complete search history.

(56) References Cited

U.S. PATENT DOCUMENTS

| 5,424,637 A | 6/1995 | Oudyn et al. |
| 2006/0136119 A1* | 6/2006 | Raichle et al. ................. 701/114 |

(Continued)

FOREIGN PATENT DOCUMENTS

| DE | 198 34 548 | 2/2000 |
| JP | H05149222 A | 6/1993 |

(Continued)

OTHER PUBLICATIONS

International Search Report for PCT/EP2012/061415, dated Feb. 21, 2013.

(Continued)

*Primary Examiner* — Eric S McCall
(74) *Attorney, Agent, or Firm* — Kenyon & Kenyon LLP

(57) ABSTRACT

A method for monitoring a meshing process of a meshing pinion of a starter motor for a vehicle drive, in which an armature of the starter motor is moved by a magnet, has the following steps: detecting a solenoid signal when a solenoid of the magnet is energized in order to obtain a signal profile, in particular a current profile; generating a differential profile by differentiating the signal profile; determining zero crossings in the differential profile; and monitoring the meshing process on the basis of the determined zero crossings.

14 Claims, 4 Drawing Sheets

(51) Int. Cl.
*G01R 31/34* (2006.01)
*F02N 15/06* (2006.01)
*F02D 41/14* (2006.01)

(56) References Cited

U.S. PATENT DOCUMENTS

| | | |
|---|---|---|
| 2006/0181084 A1 | 8/2006 | Albertson et al. |
| 2012/0204826 A1* | 8/2012 | Schmidt .................... 123/179.3 |
| 2012/0216634 A1* | 8/2012 | Tsakiris et al. ..................... 74/6 |
| 2014/0236453 A1* | 8/2014 | Casey et al. .................. 701/101 |
| 2014/0260577 A1* | 9/2014 | Chinnadurai et al. ..... 73/114.59 |
| 2014/0350829 A1* | 11/2014 | Tumback et al. ............. 701/113 |

FOREIGN PATENT DOCUMENTS

| | | |
|---|---|---|
| WO | WO 2010/015450 | 2/2010 |
| WO | WO 2011/080010 | 7/2011 |

OTHER PUBLICATIONS

Greg Welch et al., "An Introduction to the Kalman Filter" Technical Report, Dept. of Computer Science, Chapel Hill, NC, vol. 95, No. 41, Jul. 24, 2006, pp. 1-15.

* cited by examiner

METHOD AND DEVICE FOR MONITORING A MESHING PROCESS OF A MESHING PINION OF A STARTER MOTOR

BACKGROUND OF THE INVENTION

1. Field of the Invention

The present invention relates to a method and a device for monitoring a meshing process of a meshing pinion of a starter motor for a vehicle drive, in which an armature of the starter motor is moved by a magnet.

2. Description of the Related Art

Starter motors are known in which a meshing pinion of the starter motor is meshed with a ring gear of a vehicle drive, in particular of an internal combustion engine, during the starting operation with the aid of a solenoid. For example, the meshing pinion closes a contact bridge in the solenoid during or prior to reaching a meshed end position, thus supplying the electric starter motor with current.

In the ideal case, the meshing pinion of the starter motor and a corresponding ring gear in the vehicle drive are rotated relative to one another in such a way that the meshing pinion slides directly into the ring gear when a solenoid is activated. However, it is also possible for a tooth of the pinion to initially completely or partially overlap with a tooth of the ring gear during the meshing process, thus preventing the direct meshing. In particular a worn pinion or ring gear may result in a situation where the starter motor begins to rotate, and the meshing pinion does not mesh with the ring gear due to the tooth position. Instead, the teeth of the meshing pinion and the teeth of the ring gear may slide over one another, so that the vehicle drive is not driven by the starter motor.

In conventional starter motors, for example, a check is made via a function of the internal combustion engine as to whether a meshing process has concluded after a determined time period. If no successful meshing process can be detected after this determined time period, the meshing process is terminated, for example, and may be restarted. However, this may have adverse effects on the operation of starter motors in start-stop systems, in which the vehicle drive is to be restarted in the shortest possible time.

BRIEF SUMMARY OF THE INVENTION

The object of the present invention is providing a method and a device for monitoring a meshing process of a meshing pinion of a starter motor for a vehicle drive, via which a meshing process may be monitored in a simplified manner.

According to one aspect, a method for monitoring a meshing process of a meshing pinion of a starter motor for a vehicle drive is provided in which an armature of the starter motor is moved by a magnet. To obtain a signal profile, in particular a current profile, a solenoid signal is detected when a solenoid of the magnet is energized. The magnet is an electromagnet, for example. A differential profile is generated by differentiating the signal profile. Zero crossings in the differential profile are determined, and the meshing process is monitored on the basis of the determined zero crossings.

For example, a number of zero crossings in the differential profile is determined, as well as a direction of the ascertained zero crossings, in particular whether the zero crossings run in the positive or the negative direction, i.e., run from a negative value to a positive value or vice versa. Based on the number and the course direction of the zero crossings, a curve of the signal profile may be deduced, on the basis of which the quality of the meshing process may be determined.

According to one advantageous specific embodiment, during the monitoring of the meshing process it is ascertained whether the meshing process has been or is being successfully carried out. In various specific embodiments, the ascertained quality or the monitoring of the meshing process also includes, for example, at least one of the following: a meshing process which may be successfully carried out, a meshing process which takes place in a delayed manner, a meshing process which has not been successfully carried out, a meshing process which cannot be successfully carried out, and a tooth-on-tooth position of the meshing pinion during the meshing process. The quality of the meshing process may thus be assessed with little effort.

For example, the signal profile is detected by measuring a signal profile, in particular a current profile, at a starter relay of the starter motor. The measurement of the signal profile or the solenoid signal may be carried out, for example, at a terminal of the starter relay via which the magnet, for example a solenoid, is supplied with current for energizing the armature, for this purpose a shunt preferably being used as a resistance gauge. For example, such a terminal is a so-called "terminal 50" of a vehicle electrical system.

The signal profile is differentiated, for example, by analog-digital conversion of the signal profile. In various specific embodiments the signal profile may be filtered prior to the differentiation, for example in the analog area, in the digital area, or in the analog and the digital areas. For example, a recursive filter, in particular a filter having an infinite impulse response, a so-called IIR filter, may be used as the filter.

In addition, it is possible for the signal profile to be scaled prior to the differentiation in order to obtain, for example, uniform proportions in the evaluation of the differential profile. The scaling is carried out, for example, based on a value of a vehicle supply voltage which is provided by a vehicle battery, for example. Such a voltage is provided, for example, by a so-called "terminal 15" of a vehicle electrical system.

Furthermore, in various specific embodiments it is possible for the differential profile to be filtered prior to determining the zero crossings in order to simplify the determination of the zero crossings. The filtering of the differential profile may take place as an alternative or in addition to filtering of the signal profile. Such filters are designed in particular as low pass filters to be able to filter out superimposed noise or interference.

According to one advantageous specific embodiment, the procedure according to the following description, for example, is carried out for determining the zero crossings and for monitoring the meshing process. A first zero crossing is detected in the differential profile which runs from a positive value to a negative value. Such a first zero crossing results, for example, from a first local maximum in the signal profile. In addition, a second zero crossing is detected in the differential profile which runs from a negative value to a positive value 15. The second zero crossing is detected in particular after the first zero crossing in terms of time. The second zero crossing results, for example, from a first local minimum in the signal profile. In addition, it is detected whether a third zero crossing is present after the second zero crossing in the differential profile, which runs from a negative value to a positive value. Such a third zero crossing results, for example, from a second local minimum in the signal profile. Since it is assumed that the signal profile reverts to a base value, for example zero, at the end of the meshing process, the second local minimum is followed by a subsequent, further, in particular third, local maximum which indicates a meshing process which has not been or cannot be successfully carried out. Accordingly, in the monitoring of the meshing process, the meshing process is classified as capable of being successfully carried out when no third zero crossing is detected, and is classified as not capable of being successfully carried out when a third zero crossing is detected.

For example, the detection of a third zero crossing in the differential profile is a function of time. Accordingly, in one specific embodiment of the meshing process a classification is made as capable of being successfully carried out when no third zero crossing is detected within a predefined time period after the second zero crossing. The predefined time period is ascertained, for example, based on a time difference between the first zero crossing and the second zero crossing. The predefined time is, for example, proportional to such a time difference.

In various specific embodiments the method, in particular having the detection of the first and second zero crossings, may be carried out in a state machine or an automatic state machine.

In various specific embodiments the result of the ascertained quality or of the monitoring of the meshing process may be evaluated for further subsequent actions. For example, at least one of the following is carried out when the meshing process is classified as not capable of being successfully carried out: the signal profile is stored, for example, in order to evaluate it later together with other stored signal profiles; an error counter is incremented in order to be evaluated, for example, during service or inspection of the starter motor as an indication of wear of the starter motor; the meshing process is terminated and/or restarted to prevent or reduce possible mechanical wear during a faulty meshing process; a warning message is output, for example, to a control electronics system, or to a user via the control electronics system.

According to another aspect, a device for monitoring a meshing process of a meshing pinion of a starter motor for a vehicle drive is provided, in which an armature of the starter motor is moved by a magnet. The device includes a sensor which is set up to detect a solenoid signal when a solenoid of the magnet is energized, in order to obtain a signal profile, in particular a current profile, and a processor which is set up to generate a differential profile by differentiating the signal profile to determine zero crossings in the differential profile, and to monitor the meshing process on the basis of the determined zero crossings.

A device of this type may advantageously be used, for example, in vehicles, in particular motor vehicles having internal combustion engines. This ascertainment may be reliably carried out with little time delay, in particular during the meshing process, by monitoring the meshing process on the basis of the determined zero crossings. A device of this type may thus be advantageously used in internal combustion engines having a start-stop function, in which a rapid and error-free starting operation is important, in particular compared to conventional internal combustion engines without a start-stop function.

However, the device may also be used with other internal combustion engines, in particular engines that are gradually being phased out, or engines having automatic transmissions, regardless of whether a start-stop function for such engines is implemented.

Various specific embodiments of the device, in particular of the sensor and the processor, result from the above-described specific embodiments of the method which may be implemented using the sensor and the processor.

In particular, the processor has, for example, a state machine which is set up to determine the zero crossings in the differential profile and to monitor the meshing process. In particular, in such a state machine a specific embodiment may be implemented in which, similarly to the above-described method, a first and a second zero crossing are detected, and it is detected whether a third zero crossing is present in the differential profile.

According to one alternative aspect, the present invention relates to a method for monitoring a meshing process of a meshing pinion of a starter motor for a vehicle drive, in which an armature of the starter motor is moved by a magnet, in which generation of a differential profile by differentiation of the signal profile is replaced by the observation of the signal profile in order to obtain an observation profile in which the determination of zero crossings in the differential profile is replaced by the determination of zero crossings in the observation profile, and in which the monitoring of the meshing process on the basis of the determined zero crossings is replaced by the monitoring of the meshing process on the basis of the determined zero crossings in the observation profile.

According to one specific embodiment, the observation profile is advantageously obtained by Kalman filtering of the signal profile or by using a real-time model of the mechanical kinematics and/or electrical parameters of the armature and/or of the starter motor.

According to one alternative aspect, the present invention relates to a device for monitoring a meshing process of a meshing pinion of a starter motor for a vehicle drive, in which an armature of the starter motor is moved by a magnet, the device including a sensor which is set up to detect a solenoid signal when a solenoid of the magnet is energized, and to obtain a signal profile, in particular a current profile, and a processor which is set up to generate an observation profile by observing the signal profile, to determine zero crossings in the observation profile, and to monitor the meshing process on the basis of the determined zero crossings.

According to one specific embodiment, the observation profile is advantageously obtained by Kalman filtering of the signal profile or by using a real-time model of the mechanical kinematics and/or electrical parameters of the armature and/or of the starter motor.

The exemplary embodiments described above and in the following discussion correspondingly apply to the mentioned replacements, also for the alternative aspects of the present invention.

The present invention is explained in greater detail below based on exemplary embodiments, with reference to the figures.

DETAILED DESCRIPTION OF THE INVENTION

Figure 1:
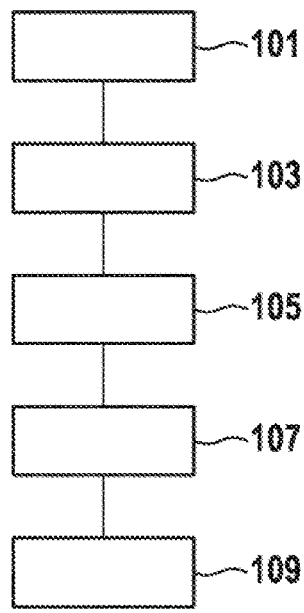
FIG. 1 shows a schematic flow chart of a method for monitoring a meshing process of a meshing pinion.

FIG. 1 shows a schematic flow chart of a method for monitoring a meshing process of a meshing pinion. The meshing process is started, for example, by setting an armature of the starter motor in motion via a solenoid, in a step 101. For this purpose, for example a magnet coil of the solenoid is supplied with current. A solenoid signal is detected in a subsequent step 103 when the solenoid of the magnet is energized in order to obtain a signal profile, in particular a current profile. A differential profile is generated in a step 105 by differentiating the signal profile. The signal profile may be filtered prior to the differentiation, or the differential profile may be filtered, or filtering may be carried out before and after the differentiation. In addition, the signal profile may be scaled prior to the differentiation. The scaling is carried out, for example, based on a value of a vehicle supply voltage which is provided by a vehicle battery, for example. Such a voltage is provided, for example, by a so-called "terminal 15" of a vehicle electrical system. Zero crossings in the differential profile are determined in a step 107, and the meshing process is monitored and the quality of the meshing process is ascertained on the basis of the determined zero crossings in a step 109.

The quality of the meshing process relates, for example, to how the meshing process proceeds. For example, the meshing process may be carried out properly and quickly so that a meshing process which has or may be successfully carried out is present. However, if the meshing process differs from this type of ideal pattern, a faulty meshing process may also be ascertained as a property, various gradations for such a faulty meshing process being possible.

Figure 2A:
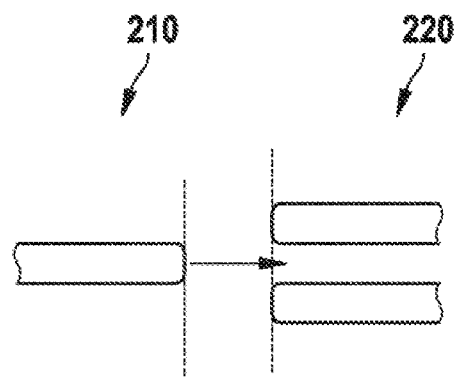
FIG. 2 shows a schematic illustration of a first example of a meshing process.
Figure 2B:
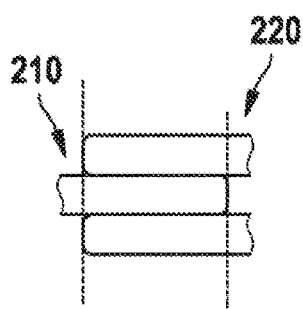

FIG. 2 shows an example of a schematically illustrated pattern of a successful meshing process. A tooth 210 of the meshing pinion of a starter motor and teeth 220 of an ring gear of a vehicle drive, for example of an internal combustion engine, to be started are illustrated as an example. In the illustration in FIG. 2a, a force is exerted on tooth 210 in the direction of the arrow with the aid of the solenoid in order to mesh tooth 210 with teeth 220 of the ring gear. Tooth 210 is positioned relative to teeth 220 of the ring gear in such a way that meshing may take place directly and without hindrances. Accordingly, FIG. 2b illustrates tooth 210 of the meshing pinion in the meshed state in the ring gear.

Figure 3A:
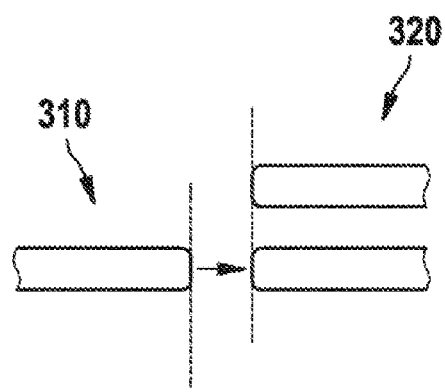
FIG. 3 shows a schematic illustration of a second example of a meshing process.
Figure 3B:
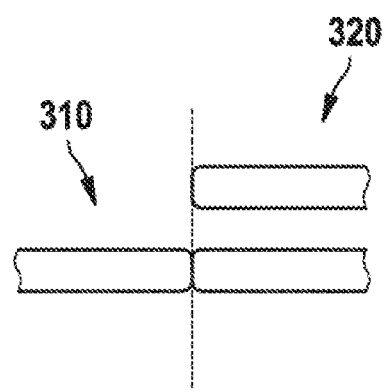

FIG. 3 illustrates an example of a faulty meshing process of a tooth 310 of a meshing pinion in teeth 320 of a ring gear. In a starting position shown in FIG. 3a, in which tooth 310 is set in motion, tooth 310 is positioned relative to the ring gear in such a way that tooth 310 is situated opposite from one of teeth 320. This results, for example, in a configuration as illustrated in FIG. 3b, in which tooth 310 abuts on one of teeth 320. In this case, this may also be referred to as a tooth-on-tooth position of the meshing pinion. It is apparent that this does not result in direct meshing of the meshing pinion. Instead, the meshing process will proceed at least with delay, in particular compared to a meshing process which proceeds ideally. In addition, in this configuration it is possible that the meshing process cannot be successfully carried out.

In various embodiments, in the event of a tooth-on-tooth position it may be necessary for the teeth of the pinion to overpressure a meshing spring, resulting in slower run-in of the armature of the starter motor. Such a slow run-in may on the one hand result in delayed meshing of the meshing pinion with the ring gear, or on the other hand may indicate so-called "ratcheting," i.e., continuous skipping of the pinion on the ring gear, which may prevent the starting operation.

Figure 4:
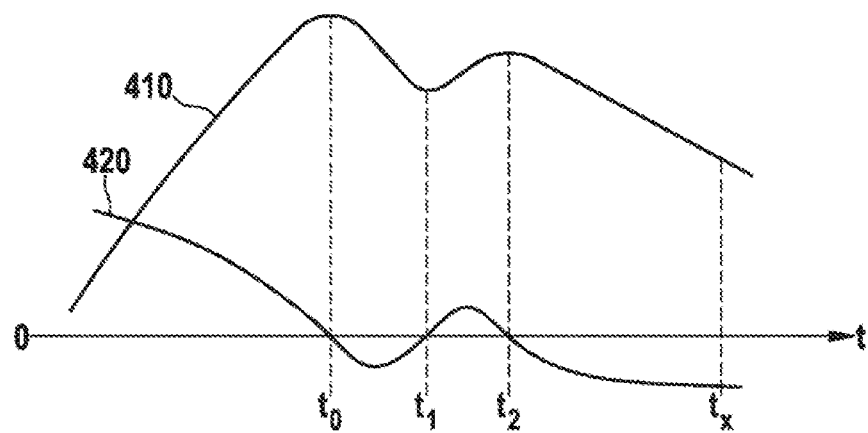
FIG. 4 shows a first example of a signal profile together with a differential profile.

FIG. 4 shows a first example of a signal profile 410 together with a differential profile 420 derived therefrom. It is apparent that signal profile 410 has two local maxima. Such a signal profile may therefore be associated, based on experience, with a meshing process which has successfully been carried out. At point in time t0, at which signal profile 410 has its first local maximum, differential profile 420 accordingly shows a zero crossing running in the negative direction, which is detectable as a first zero crossing. A zero crossing running in the positive direction, which results from a first local minimum in signal profile 410, is detectable in differential profile 420 at point in time t1. A further zero crossing at point in time t2 which runs in the negative direction results from the second local maximum in signal profile 410. After point in time t2, signal profile 410 continuously drops, so that differential profile 420 remains negative. At a point in time tx, selected as an example, up to which the signal patterns of signal profile 410 and of differential profile 420 essentially continuously run further, it may be assumed, and a classification may be made, that the meshing process has taken place successfully. A selection of point in time tx, in particular of a time interval from point in time tx to point in time t2, results, for example, on the basis of a time difference between points in time t2 and t0.

Figure 5:
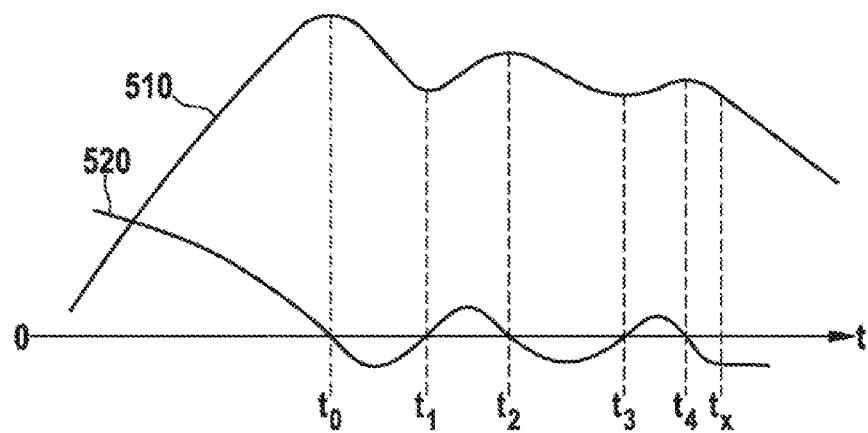
FIG. 5 shows a second example of a signal profile together with a differential profile.

FIG. 5 shows a second example of a signal profile 510 together with a differential profile 520 derived therefrom. Signal profile 510 has three local maxima, so that the illustrated profiles may be associated, based on experience, with a meshing process which has not been successfully carried out. Up to point in time t2, signal profile 510 and differential profile 520 have a pattern similar to signal profile 410 and differential profile 420, respectively, in FIG. 4. Therefore, a corresponding description is dispensed with in order to avoid repetition. Thus, a second local maximum in signal profile 510 having an associated zero crossing running in the negative direction in differential profile 520 is present at point in time t2. Unlike the signal patterns of the successfully carried out meshing process, differential profile 520 has a zero crossing at point in time t3 which runs further in the positive direction and which may be detected as a third zero crossing. Accordingly, signal profile 510 has a further local minimum at point in time t3, which is followed by the third local maximum at point in time t4. Such a third local maximum indicates a meshing process which has not been or cannot be successfully carried out.

For reasons of clarity, the diagram in FIG. 5 also illustrates point in time tx, prior to which the second zero crossing running in the positive direction is to be detected in order to be able to identify a meshing process which has not been or cannot be successfully carried out.

Figure 6:
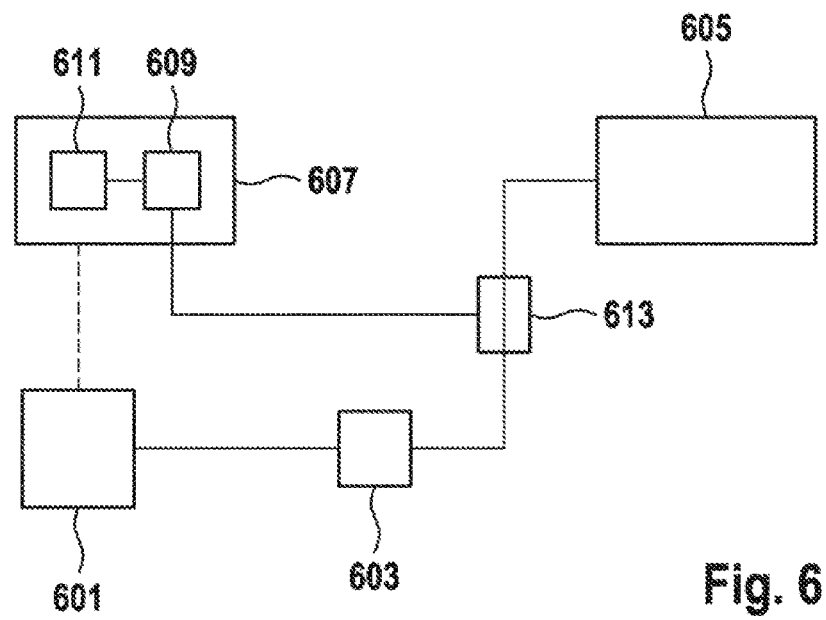
FIG. 6 shows a schematic illustration of a device for monitoring a meshing process of a meshing pinion.

FIG. 6 shows a schematic illustration of a starter system having a starter control system 601, a starter relay 603, and a starter motor 605. The system also includes a monitoring device 607 having a sensor 609 and a processor 611, sensor 609 being coupled to a resistance gauge or shunt 613.

Starter control system 601 is coupled to starter relay 603 in order to trigger a starting operation of starter motor 605 via starter relay 603. Starter control system 601 may be coupled to monitoring device 607 in order to deliver to device 607 information concerning a starting operation to be started. Sensor 609 detects a solenoid signal, in particular a current, at starter relay 603, via resistance gauge 613. This solenoid signal is further processed, in particular filtered and differentiated, as a signal profile in processor 611 in order to generate a differential profile as illustrated in FIG. 4 and FIG. 5, for example. The zero crossings in the signal profile are also detected in processor 611 in order to monitor the meshing process on the basis of the ascertained zero crossings. In this regard, in particular the method described in conjunction with the previous figures is used, and is not explained in further detail at this point in order to avoid repetition.

A system as illustrated in FIG. 6 may be advantageously used in particular in a motor vehicle having an internal combustion engine. Such a system is suited in particular for engines having a start-stop function, in which the internal combustion engine is stopped during a standing phase of the vehicle, for example during a stop at a traffic light, and is restarted via the starter motor upon a driver input for continued travel.

Figure 7:
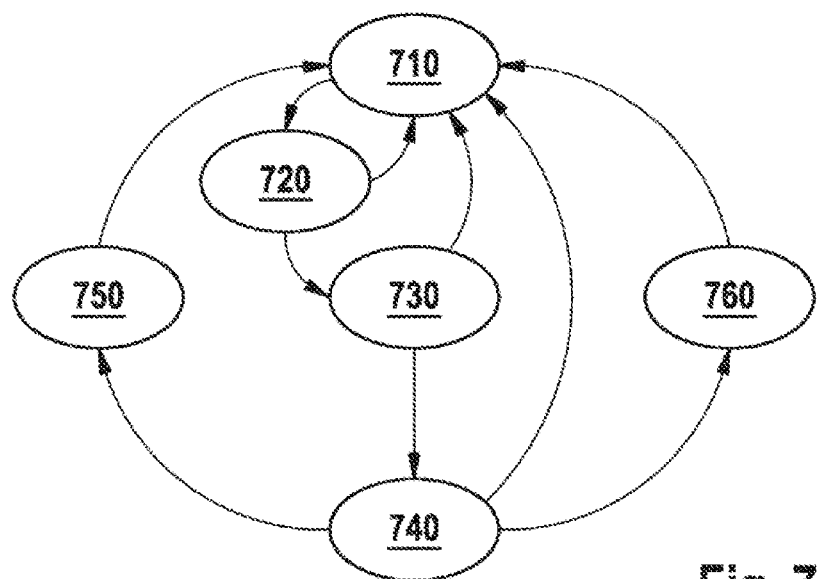
FIG. 7 shows an example of a state machine.

FIG. 7 shows an example of a state machine which, for example, is implemented in processor 611 or is included by same. As a result of the state machine, the quality of the meshing process may be determined and the meshing process may be monitored in processor 611. State 710 corresponds to a base state of the system, for example prior to the start of a meshing process, or after a meshing process has concluded. A switch is made from base state 710 to a first state 720 in which a check is made as to whether a meshing process has begun, for example by evaluating the signal profile or the differential profile. For example, an analysis is made in state 720 as to whether the differential profile has exceeded a determined limit value, so that a rising curve in the signal profile is present. When such a rise is detected, a switch is made from state 720 to state 730; otherwise, a switch is made back to base state 710. In state 730 a first zero crossing in the differential profile is detected which runs from a positive value to a negative value, corresponding to the first local maximum in the signal profile. This corresponds, for example, to point in time t0 in FIG. 4 and FIG. 5.

When the first zero crossing is detected, a skip is made to next state 740; otherwise, a skip is made back to base state 710, whereby the skip back may be carried out as a function of time. In state 740 an attempt is initially made to detect a second zero crossing which is present after the first zero crossing in terms of time, and which runs from a negative value to a positive value, corresponding to point in time t1 in FIG. 4 and FIG. 5. When the second zero crossing is detected, a counter is started and a search is made for a third zero crossing in the differential profile which runs from a negative value to a positive value. If no such third zero crossing can be detected, a skip is made back to base state 710.

The search or detection of the third zero crossing takes place for a predefined time period which is determined, for example, from the time difference between the first and the second zero crossing. If no third zero crossing can be detected within the predefined time period, a skip is made to state 750, in which a classification is made of a meshing process which can be successfully carried out. In addition, an appropriate signal is provided to a monitoring device 607 or starter control system 601 in state 750. A skip is subsequently made back to base state 710.

If a third zero crossing which runs from a negative value to a positive value is detected within the predefined time, a switch is made to state 760. In state 760 a classification is made of a meshing process which cannot be successfully carried out, for example due to a tooth-on-tooth position of the meshing pinion. Information concerning this state, i.e., the meshing process which cannot be successfully carried out, is further signaled, for example to monitoring device 607 or starter control system 601. A switch is subsequently made once again to base state 710.

In summary, the present invention provides a method and a device which in particular allow a meshing process of a meshing pinion of a starter motor to be monitored in such a way that the quality of the meshing process may be reliably established within a short time, and in particular whether the meshing process is being carried out in an error-free manner or in a faulty manner.

What is claimed is:

1. A method for monitoring a meshing process of a meshing pinion of a starter motor for a vehicle drive, in which an armature of the starter motor is moved by a magnet, comprising:
   detecting a solenoid signal when a solenoid of the magnet is energized, and obtaining a signal profile of the solenoid signal, the signal profile representing a current profile;
   generating a differential profile by differentiating the signal profile;
   determining (i) a number of zero crossings in the differential profile and (ii) a course direction of the ascertained zero crossing; and
   determining a curve of the signal profile based on the number and the course direction of the zero crossings, wherein a quality of the meshing process is determined based on the curve of the signal profile.

2. The method as recited in claim 1, wherein prior to the generation of the differential profile, the signal profile is filtered using a recursive filter.

3. The method as recited in claim 1, wherein prior to the generation of the differential profile, the signal profile is scaled based on a value of a vehicle supply voltage.

4. The method as recited in claim 1, wherein a determination is made whether the meshing process can be carried out successfully.

5. The method as recited in claim 4, wherein:
   the determination of the zero crossings includes the following steps: (i) detecting a first zero crossing in the differential profile which runs from a positive value to a negative value; (ii) detecting, after the first zero crossing, a second zero crossing in the differential profile which runs from a negative value to a positive value; and (iii) detecting whether a third zero crossing in the differential profile, which runs from a negative value to a positive value, is present after the second zero crossing; and
   the meshing process is classified as capable of being successfully carried out when no third zero crossing is detected, and the meshing process is classified as not capable of being successfully carried out when a third zero crossing is detected.

6. The method as recited in claim 5, wherein the differential profile is filtered prior to determining the zero crossings.

7. The method as recited in claim 5, wherein the meshing process is classified as capable of being successfully carried out when no third zero crossing is detected within a predefined time period after the second zero crossing.

8. The method as recited in claim 7, wherein the predefined time period is ascertained based on a time difference between the first zero crossing and the second zero crossing.

9. A method for monitoring a meshing process of a meshing pinion of a starter motor for a vehicle drive, in which an armature of the starter motor is moved by a magnet, comprising:
   detecting a solenoid signal when a solenoid of the magnet is energized, and obtaining a signal profile of the solenoid signal, the signal profile representing a current profile;
   observing the signal profile to generate an observation profile;
   determining (i) a number of zero crossings in the observation profile and (ii) a course direction of the ascertained zero crossing; and
   determining a curve of the signal profile based on the number and the course direction of the zero crossings, wherein a quality of the meshing process is determined based on the curve of the signal profile.

10. The method as recited in claim 9, wherein the observation profile is obtained by one of (i) Kalman filtering of the signal profile or (ii) using a real-time model of at least one of mechanical kinematics and electrical parameters.

11. A device for monitoring a meshing process of a meshing pinion of a starter motor for a vehicle drive, in which an armature of the starter motor is moved by a magnet, comprising:
  a sensor configured to (i) detect a solenoid signal when a solenoid of the magnet is energized, and (ii) generate a signal profile of the solenoid signal, the signal profile representing a current profile; and
  a processor configured to:
    generate a differential profile by differentiating the signal profile;
    determine (a) a number of zero crossings in the differential profile and (b) a course direction of the ascertained zero crossing; and
    determine a curve of the signal profile based on the number and the course direction of the zero crossings, wherein a quality of the meshing process is determined based on the curve of the signal profile.

12. The device as recited in claim 11, wherein the processor has a state machine which is configured to determine the zero crossings in the differential profile and to determine the quality of the meshing process.

13. A device for monitoring a meshing process of a meshing pinion of a starter motor for a vehicle drive, in which an armature of the starter motor is moved by a magnet, comprising:
  a sensor configured to (i) detect a solenoid signal when a solenoid of the magnet is energized, and (ii) generate a signal profile of the solenoid signal, the signal profile representing a current profile; and
  a processor configured to:
    observe the signal profile to generate an observation profile;
    determine (a) a number of zero crossings in the observation profile and (b) a course direction of the ascertained zero crossing; and
    determine a curve of the signal profile based on the number and the course direction of the zero crossings, wherein a quality of the meshing process is determined based on the curve of the signal profile.

14. The device as recited in claim 13, wherein the observation profile is obtained by Kalman filtering of the signal profile or by using a real-time model of the mechanical kinematics and/or electrical parameters.

* * * * *